(12) United States Patent
Delbaere et al.

(10) Patent No.: US 11,714,133 B2
(45) Date of Patent: Aug. 1, 2023

(54) METHODS FOR ESTIMATING A PROPERTY OF AN ELECTRICAL SWITCHING DEVICE, ASSOCIATED DEVICES

(71) Applicant: Schneider Electric Industries SAS, Rueil Malmaison (FR)

(72) Inventors: Stéphane Delbaere, Meylan (FR); Rémy Orban, Saint Martin d'Uriage (FR); Philippe Guibert, Vif (FR); Christian Jarrige, Saint Aupre (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 74 days.

(21) Appl. No.: 17/376,348

(22) Filed: Jul. 15, 2021

(65) Prior Publication Data
US 2022/0018904 A1 Jan. 20, 2022

(30) Foreign Application Priority Data
Jul. 20, 2020 (FR) ...................................... 2007593

(51) Int. Cl.
*G01R 31/327* (2006.01)
*H01F 7/18* (2006.01)
(Continued)

(52) U.S. Cl.
CPC ....... *G01R 31/3278* (2013.01); *H01F 7/1844* (2013.01); *H01H 47/002* (2013.01); *H01H 50/44* (2013.01)

(58) Field of Classification Search
CPC .......................... G01R 31/3278; H01H 47/002
See application file for complete search history.

(56) References Cited

U.S. PATENT DOCUMENTS

| 5,243,296 A * | 9/1993 | Ando | G01R 31/2829 |
| | | | 324/207.22 |
| 6,895,997 B2 * | 5/2005 | Qu | G05B 19/19 |
| | | | 137/554 |

(Continued)

FOREIGN PATENT DOCUMENTS

| DE | 10149982 A1 * | 4/2003 | ........... F02D 41/064 |
| EP | 2998977 A1 | 3/2016 | |

(Continued)

OTHER PUBLICATIONS

French Search Report and Written Opinion dated Mar. 17, 2021 for corresponding French Patent Application No. 2007593, 7 pages.

*Primary Examiner* — Walter L Lindsay, Jr.
*Assistant Examiner* — Milton Gonzalez
(74) *Attorney, Agent, or Firm* — Locke Lord LLP

(57) ABSTRACT

A method for estimating a property of an electrical switching device that includes an electromagnetic actuator that includes a coil. The method includes: measuring electric current flowing through the coil; measuring supply electrical voltage of a control circuit for the actuator; injecting an electric current pulse into the coil; identifying a first time corresponding to a time for which the current flowing through the coil reaches a predetermined threshold value when the current increases following the injection of the pulse; and identifying a second time corresponding to a time for which the current flowing through the coil again reaches the predetermined threshold value when the current decreases after a spike. The method further includes estimating a resistance of the coil on the basis of a ratio of a sum of the values of the voltage that are measured between the second time and the first time, to a sum of the values of the current that are measured between the second time and the first time.

19 Claims, 5 Drawing Sheets

(51) Int. Cl.
    *H01H 47/00*     (2006.01)
    *H01H 50/44*     (2006.01)

(56)     References Cited

U.S. PATENT DOCUMENTS

2018/0174786 A1    6/2018    Matsuo et al.
2019/0057827 A1    2/2019    Khan

FOREIGN PATENT DOCUMENTS

| WO | WO-2016026628 A1 * | 2/2016 | ............. | G01R 31/06 |
| WO | WO-2016026629 A1 * | 2/2016 | ............. | G01R 31/06 |

* cited by examiner

METHODS FOR ESTIMATING A PROPERTY OF AN ELECTRICAL SWITCHING DEVICE, ASSOCIATED DEVICES

TECHNICAL FIELD

The present invention relates to methods for estimating a property of an electrical switching device, and to associated devices for implementing these methods.

More particularly, the invention relates to electrical contactors including an electromagnetic actuator comprising a coil.

BACKGROUND

Such electrical switching devices are configured for switching between an open state and a closed state, for example in order to control the power supply to an electrical load. Moving electrical contacts are usually connected to a moving part of the actuator which is moved by the action of a magnetic field created by the coil when a suitable electric current passes through it.

It is desirable to be able to estimate one or more properties of the device automatically when it is in operation, for example in order to discover its state and/or to detect the appearance of malfunctions and thus provide suitable preventive maintenance.

Some devices have dedicated sensors for measuring properties of the device such as the temperature or the state of wear of the electrical contacts. However, these sensors increase the production cost of the device. Moreover, it is not always possible to integrate a new sensor into an existing device.

SUMMARY

The invention is intended, more particularly, to overcome these drawbacks by proposing methods for estimating one or more properties of an electrical switching device.

To this end, one aspect of the invention relates to a method for estimating a property of an electrical switching device, said device including an electromagnetic actuator comprising a coil, this method including steps consisting of:
 measuring the electric current flowing through the coil;
 measuring the supply electrical voltage of a control circuit for the actuator;
 injecting an electric current pulse into the coil of the actuator;
 identifying a first time corresponding to the time for which the current flowing through the coil reaches a predetermined threshold value when said current increases following the injection of the pulse;
 identifying a second time corresponding to the time for which the current flowing through the coil again reaches the predetermined threshold value when said current decreases after the spike;
 estimating the resistance of the coil on the basis of the ratio of the sum of the values of said voltage that are measured between the second time and the first time, to the sum of the values of said current that are measured between the second time and the first time.

The invention makes it possible to determine, automatically and reliably, the value of the resistance of the coil of the actuator during the operation of the device, without the need for a dedicated sensor.

According to some advantageous but non-mandatory aspects, such a method may incorporate one or more of the following features, taken alone or in any technically permissible combination:
 The method further comprises a step of estimating the inductance of the coil of the actuator on the basis of the estimated resistance value.
 The inductance is calculated by means of the following formula:

$$L = \frac{Drl \cdot Toff - (Rsh + RT1 + Rbob) \cdot \sum_{t+Ton}^{t+Ton+Toff} Icoil}{(Icoil_{Ton} - Icoil_{Toff})}$$

in which Rbob is the estimated resistance value, $Icoil_{Ton}$ and $Icoil_{Toff}$ are, respectively, the current values measured at the peak of the pulse and at the end of the pulse of current, Toff is the remaining duration of the current pulse after the peak of the pulse has been reached, and Dr1, Rsh and RT1 are design constants for the device, recorded in memory.

The method further comprises a step of estimating the temperature of the coil of the actuator on the basis of the estimated resistance value.
 The temperature of the coil is calculated iteratively by means of the following formula:

$$Temp_2 = \frac{\frac{Rbob_1}{Rbob_2} - 1}{K} + Temp_1$$

in which Temp2 is the current value of the temperature of the coil, Temp1 is the preceding estimate of the temperature, Rbob2 is the current value of the resistance of the coil, Rbob1 is a preceding value of the resistance of the coil, and K is the thermal coefficient of the material forming the coil.
 The resistance of the coil is estimated by means of the following formula:

$$R = \frac{(R2 + R1)/R1 \cdot \sum_{t}^{t+Ton} trs + \frac{Toff}{Ton + Toff} \cdot Drl - RT4 \cdot \sum_{t}^{t+Ton} Icoil}{\sum_{c}^{c+Ton+Toff} Icoil} - (Rsh + RT1)$$

in which the sum $\Sigma_t^{t+Ton+Toff} Icoil$ is the sum of the current values measured between the first and second times, "trs" is the measured coil voltage, "t" is the first time defined above, Ton is the duration of the current pulse between the first time t1 and the reaching of a peak value of the current pulse, Toff is the remaining duration of the current pulse after the peak current has been reached and up to the second time, and Dr1, Rsh, R1, R2, RT4 and RT1 are design constants for the device, recorded in memory.
 The method is implemented when the switching device is in the open state.
 The method is implemented when the switching device is in the closed state, preferably during a holding phase in which the current pulse is repeated periodically.

The second time is identified as the time for which the measured current value is the nearest of the measured current values to the predetermined threshold value when said current is decreasing after the spike of the pulse.

According to another aspect, the invention relates to an electrical switching device, including an electromagnetic actuator comprising a coil and a control circuit configured to implement steps consisting of:
measuring the electric current flowing through the coil;
measuring the supply electrical voltage of a control circuit for the actuator;
injecting an electric current pulse into the coil of the actuator;
identifying a first time corresponding to the time for which the current flowing through the coil reaches a predetermined threshold value when said current increases following the injection of the pulse;
identifying a second time corresponding to the time for which the current flowing through the coil again reaches the predetermined threshold value when said current decreases after the spike;
estimating the resistance of the coil on the basis of the ratio of the sum of the values of said voltage that are measured between the second time and the first time, to the sum of the values of said current that are measured between the second time and the first time.

BRIEF DESCRIPTION OF THE DRAWINGS

The invention will be more readily understood and other advantages of the invention will be more clearly apparent in the light of the following description of an embodiment of a method, provided solely by way of example, with reference to the attached drawings, in which.

DETAILED DESCRIPTION

Figure 1:
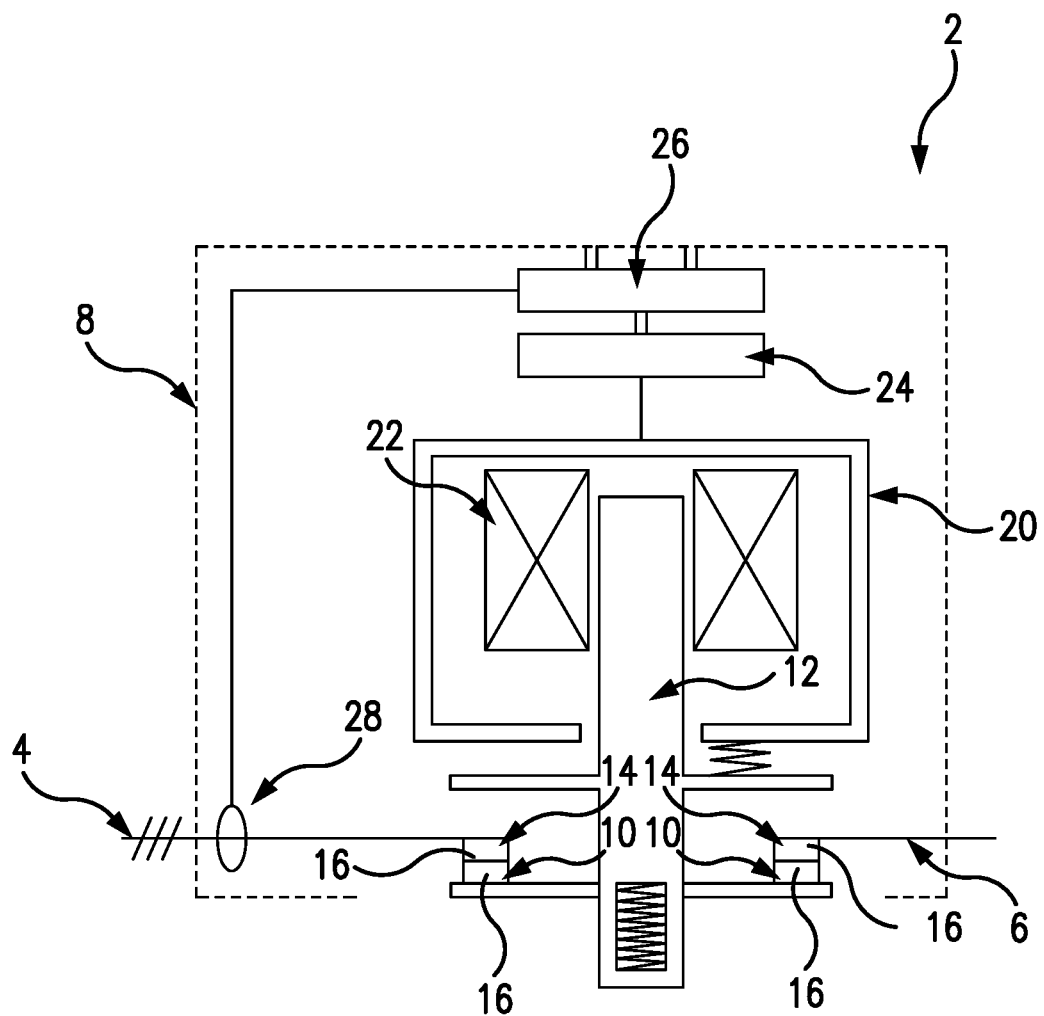
FIG. 1 is a schematic view of an electrical switching device including an electromagnetic actuator according to embodiments of the invention.

FIG. 1 shows an electrical switching device 2, such as a contactor.

The device 2 is configured to be switched between a closed state in which it allows the electric current to flow and an open state in which it prevents the flow of an electric current.

For example, the device 2 may be installed in an electrical installation to control the power supply provided to an electrical load, such as a motor, by an electrical energy source. The energy source is, for example, a power supply network or a generator.

In the illustrated example, the device 2 is connected to an upstream electrical line 4 on the one hand, and to a downstream electrical line 6 on the other hand.

The electrical lines 4 and 6 may include a plurality of electrical phases, for example in order to carry a three-phase alternating electric current. Regardless of the number of phases, the device 2 is configured to interrupt, or alternatively allow, the flow of an electric current in each of the phases. However, in order to simplify FIG. 1, only one electrical phase conductor is shown for each of the electrical lines 4 and 6.

The device 2 includes, for example, a casing 8.

For each electrical phase, the device 2 comprises separable contacts 10, arranged on a moving part 12, and fixed contacts 14, connected to the electrical lines upstream 4 and downstream 6. Each of the contacts 10 and 14 comprises contact pads 16, which in this case are made of metal, preferably silver alloy or any equivalent material.

The moving part 12 of the device 2 is movable between a closed position, in which the moving contacts 10 are in contact with the fixed contacts 14, and an open position, shown in FIG. 1, in which the moving contacts 10 are separated from the fixed contacts 14.

In practice, during each cycle comprising a closing and an opening phase, the contact pads 16 become worn, for example due to the action of electrical arcs during opening, or due to separation of material caused by micro-welds. This loss of material causes the thickness of the contact pads 16 to decrease throughout the life of the device 2, thereby increasing the amplitude of the movement of the moving part during the opening or closing phases.

To remedy this, the device 2 may include a mechanism, represented schematically by a spring in FIG. 1, which is connected to a bar of the moving part and enables the fixed and moving contacts to be kept in electrical contact with a sufficient contact pressure.

The mechanism may be adjusted to squeeze the contacts in the closed position, in order to create sufficient contact pressure. For this purpose, the mechanism may be provided with overtravel; that is to say, in the closed position the contacts are pushed to a position beyond the position that is strictly necessary to provide an electrical contact between the fixed and moving contacts.

If the thickness of the contact pads 16 is insufficient, or if the surface state of the pads 16 is poor, the risks of malfunction of the device 2 increase. The device 2 should then be replaced. It is for these reasons that a diagnosis of the state of squeezing of the contacts enables the advance of the deterioration of the device 2 to be evaluated.

The device 2 also includes an electromagnetic actuator 20 configured for moving the moving part 12 between the closed position and the open position.

The electromagnetic actuator 20 includes a coil 22 configured for generating a magnetic field when it is supplied with an electric control current, in order to move the moving part 12.

For example, the coil 22 includes a winding of electrically conductive wire. The moving part 12 may be mounted integrally with a magnetic core which is arranged coaxially with the coil 22 and which is moved by the action of the magnetic field generated by the coil 22 when the latter is energized by the injection of an appropriate electric current.

The device 2 further includes a power supply circuit 24, configured for supplying power to the coil 22, and an electronic control device 26, configured for controlling the power supply circuit 24.

In numerous embodiments, the device 2 comprises an input interface which is configured for receiving opening or closing commands from a user. For example, a control voltage may be applied between terminals of the input interface.

In numerous embodiments, the device 2 further comprises a current sensor 28 configured for measuring a current flowing in each of the phases of the upstream line 4. In other embodiments, the current sensors and the electronic control device are integrated into a casing separate from the device 2.

Figure 2:
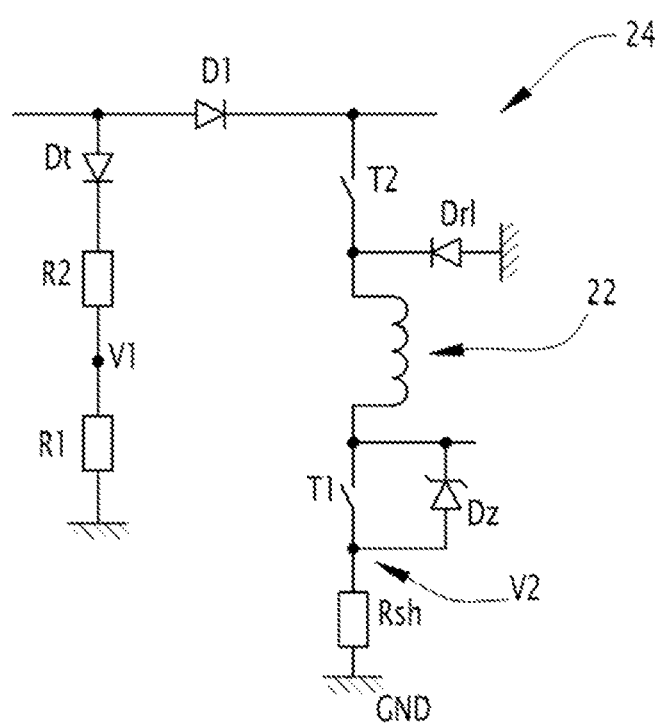
FIG. 2 is a schematic view of an example of the control circuit of the electromagnetic actuator of the switching device of FIG. 1.

FIG. 2 shows an embodiment of the power supply circuit 24.

In the illustrated example, the power supply circuit 24 includes a power supply bus Vc adapted to be supplied with power either by an external power supply or by the control signal received by the device 2.

Preferably, the power supply circuit 24 comprises a measurement device configured for measuring the value of the voltage between the power supply bus Vc and an electrical ground GND of the circuit 24.

For example, the measurement device comprises two resistors R1 and R2 connected in series with a diode Dt between the power supply bus Vc and the electrical ground GND. A first measurement point, placed between the resistors R1 and R2 in this case, may be used to collect a first measurement voltage V1 representative of the voltage present between the power supply bus Vc and the electrical ground GND.

The power supply circuit 24 also includes one or more power switches connected to the coil 22 for selectively connecting or disconnecting the coil 22 to or from the power supply bus Vc and the ground GND.

For example, a first switch T1 is connected between the coil 22 and the ground GND. A second switch T2 is connected between the coil 22 and the power supply bus Vc.

For example, when the two switches T1 and T2 are closed, a voltage depending on the voltage Vc is applied to the terminals of the coil 22, and an energizing current flows in the coil 22. When only the second switch T2 is open, the coil 22 can be discharged and a residual electric current can continue to flow temporarily in the coil 22.

The switches T1 and T2 are, for example, controlled by the electronic control device 26. According to examples of embodiment, the switches T1 and T2 are semiconductor-type power switches such as Mosfet transistors, thyristors, insulated-gate bipolar transistors (IGBT), or any other equivalent devices.

In the illustrated example, a diode Dr1, called a freewheeling diode, is connected between the second switch T2 and the ground GND. A Zener diode Dz may be connected in parallel with the first switch T1. A diode D1 may be placed on the power supply bus Vc between the second switch T2 and the measurement device in order to prevent any current return towards the latter.

In numerous embodiments, a resistor Rsh is connected in series with the first switch T1 to collect a second measurement voltage V2 representative of the electric current flowing in the coil 22.

The architecture of the power supply circuit 24 is not limiting, and there are other possible implementations.

As a general rule, the electronic control device 26 is configured for causing the device 2 to switch when it receives an appropriate control command.

Advantageously, the electronic control device 26 is also configured for estimating at least one property of the device 2 during the operation of the device 2, and notably one or more properties of the coil 22, such as the resistance of the coil 22, the inductance of the coil 22 and the temperature of the coil 22, as will be more readily apparent from a perusal of the following text.

In numerous embodiments, the electronic control device 26 is implemented by one or more electronic circuits.

For example, the electronic control device 26 includes a processor such as a programmable microcontroller or a microprocessor, and a computer memory or any medium for recording computer-readable data.

According to examples, the memory is a ROM or a RAM or a non-volatile memory of the EPROM or Flash or equivalent type. The memory includes executable instructions and/or computer code for causing the control device 26 to operate in accordance with one or more of the embodiments described below when executed by the processor.

According to variants, the electronic control device 26 may include a signal processing processor (DSP), or a reprogrammable logic component (FPGA), or an application-specific integrated circuit (ASIC), or any equivalent element.

Figure 3:
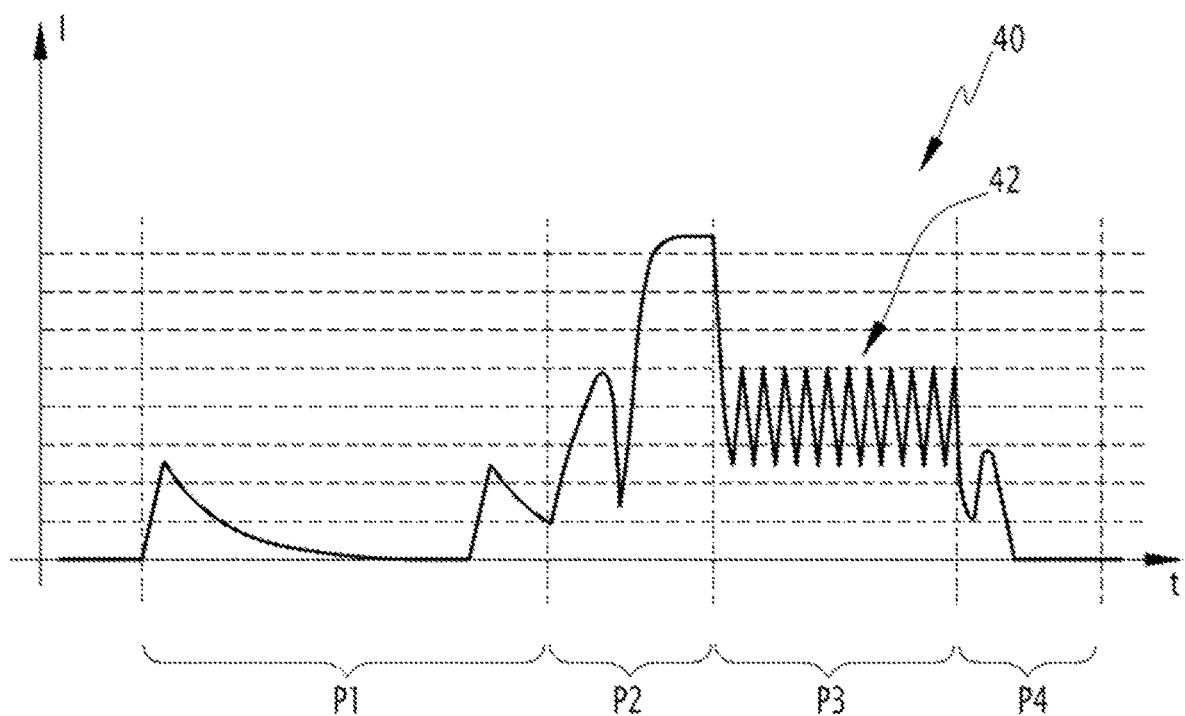
FIG. 3 is a graph representing the variation of an electric control current of the electromagnetic actuator of FIG. 2 in a number of operating phases.

FIG. 3 shows a graph 40 illustrating the variation of the electric current (I) flowing in the coil 22 during the time (t) in different successive operating phases of the device 2, denoted P1, P2, P3 and P4, in the case where the device 2 is switched to the closed state and then switched again to the open state. This electric current is referred to as the "coil current" in the following text.

The first phase P1 is an initial phase during which the device 2 is stably in the open state. In practice, the second switch T2 remains open and the coil current remains at zero.

Optionally, as seen in the figure, current pulses may be injected into the coil 22 for the estimation of said properties.

The second phase P2 is a closing phase, after a closing command has been received by the device 2. For example, the switches T1 and T2 are closed. The coil current increases until it reaches a threshold above which the moving part 12 starts to move from its open position to its closed position. In the rest of the closing phase, the coil current increases to a plateau value when the moving contacts 10 come to bear on the fixed contacts 14. The device 2 is then in the closed state.

In a third phase P3, called the holding phase, the coil current continues to be held above the threshold value. In practice, the coil current may, during this holding phase, remain below the plateau value reached in the closing phase.

Optionally, as seen in the figure, the coil voltage may be varied periodically so as to reduce the coil current as far as possible while holding it above said threshold, in order to avoid unnecessary energy losses.

In the illustrated example, the periodic variation of the coil voltage is obtained by opening and closing the second switch T2 alternately at a predefined chopping frequency, thus creating oscillations of the coil voltage according to a predefined profile. Consequently, the coil current also has oscillations 42 between two values of strength. During this time, the first switch T1 may remain closed.

To prevent the mechanical vibrations caused by these oscillations from generating a noise perceptible to the human ear, the chopping frequency is advantageously chosen to be below 100 Hz or above 25 kHz. In the illustrated example, the chopping frequency is below 100 Hz.

The opening phase P4 starts when the electronic control device 26 receives an opening command. The switches T1 and T2 are both opened.

An example of the operation of a method for estimating properties of the device 2 will now be described with reference to FIGS. 4 and 5.

Figure 5:
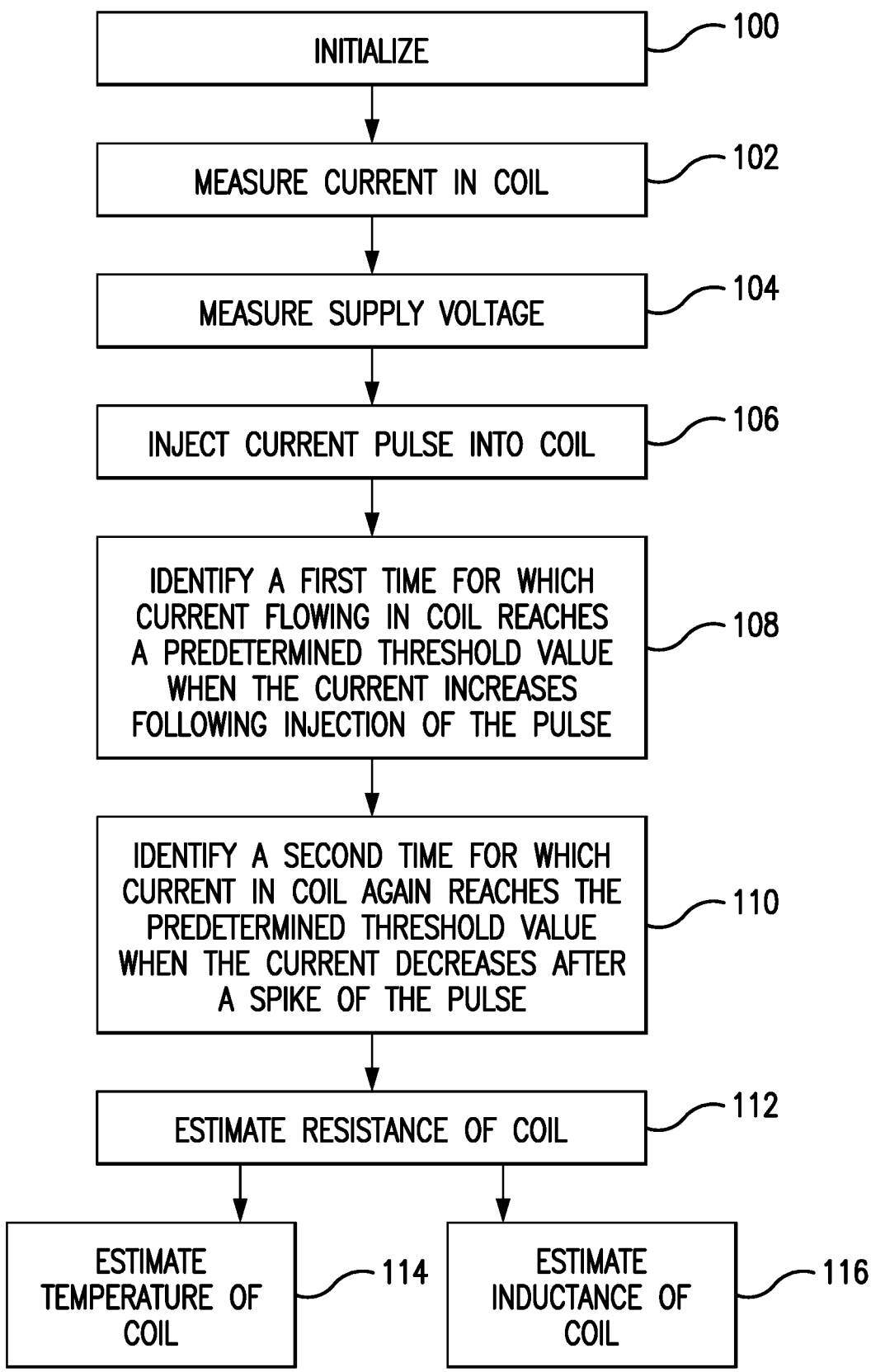
FIG. 5 is a diagram representing steps of a method for evaluating properties of the switching device of FIG. 1 according to embodiments of the invention.

As shown by the diagram of FIG. 5, the method is first initialized by a step 100.

The control circuit 26 then starts to measure the electric current flowing in the coil (step 102) and the supply voltage Vc which is set by the power supply circuit 24 (step 104).

For example, these measurements are repeated over time, in successive samplings. In the example shown in FIG. 2, these measurements consist of measuring the values of the first and second voltages V1 and V2. The measured values may be recorded in a memory of the control device 26.

Then, in step 106, an electric current pulse is injected into the coil 22 of the actuator 20 by means of the power supply circuit 24, for example by varying the voltage applied to the terminals of the coil 22. For this purpose, the switches T1 and T2 may be closed briefly.

Figure 4:
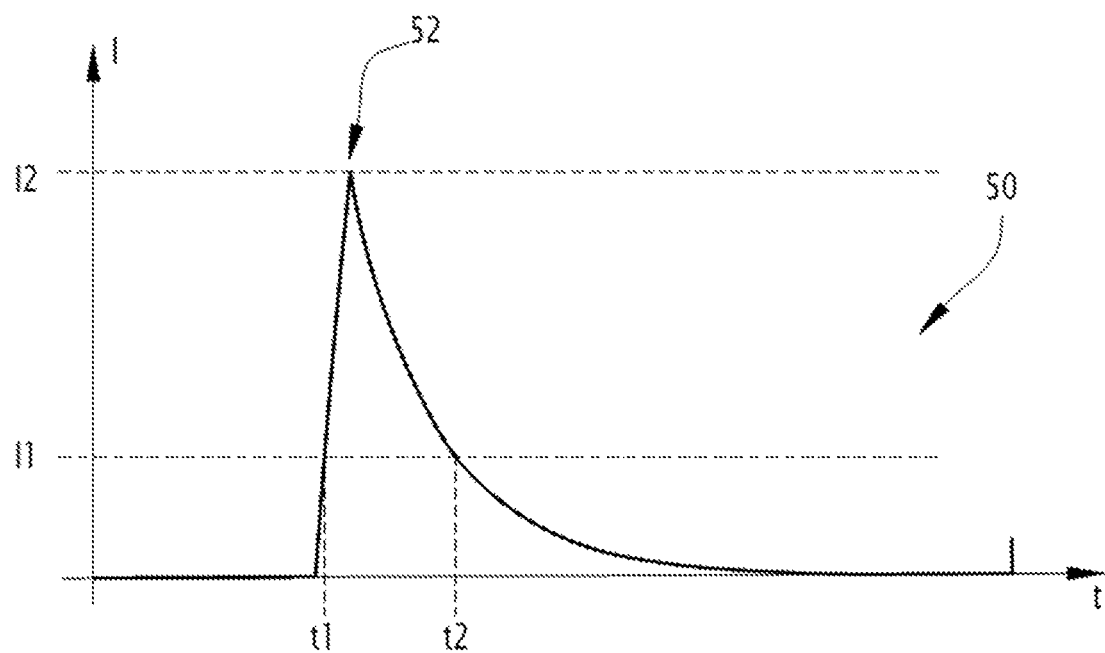
FIG. 4 is an example of an electric current pulse used for estimating one or more properties of the electromagnetic actuator of FIG. 2.

As shown in the example of FIG. 4, which represents the variation of the coil current (I) as a function of time (t), the current pulse 50 may have a rising front that increases to a maximum value I2, following a law of exponential variation for example.

Reaching this maximum value corresponds here to a spike 52 of the pulse 50.

This rising front is followed by a falling front which descends from the maximum value I2 to a final value, such as the original value or a zero value, decreasing here according to an exponential law. Thus the current pulse has what is known as a shark's fin form here.

A predetermined threshold value, here denoted I1, is defined and lies between the minimum value and the maximum value I2 of the coil current. When the current pulse 50 is injected, the coil current passes through this predetermined threshold value I1 for a first time during the rising front, then passes through this predetermined threshold value I1 for a second time during the falling front.

Thus, in a step 108 after step 106, the control device 26 identifies a first time (t1) corresponding to the time for which the current flowing through the coil reaches the predetermined threshold value I1 when said current increases following the injection of the pulse.

The predetermined threshold value I1 may be fixed in advance, being recorded in memory for example. For example, the threshold value is chosen to be sufficiently low to retain enough signal and to make the measurement. By way of example, the threshold value could be equal to 10% of the maximum value I2.

Then, in step 110, the control device 26 identifies a second time (t2) corresponding to the time for which the current flowing through the coil again reaches the predetermined threshold value I1 when said current decreases after the spike of the pulse.

For example, the identification of the first and second times is based on the coil current measurements which were started in step 102 and which continue to take place.

In step 112, the resistance of the coil is estimated on the basis of the ratio of the sum of the values of said voltage that are measured between the second time t2 and the first time t1, to the sum of the values of said current that are measured between the second time t2 and the first time t1.

According to an example of embodiment, as soon as the passage through the threshold value I1 is detected at the time t1, the control device 26 starts to sum the voltage values until the passage of the coil current through the threshold value I1 at the time t2 is detected, and records the corresponding sum ΣU in memory. The control device 26 proceeds in the same way for the measured values of coil current, and records the corresponding sum ΣI in memory.

The resistance value, denoted R, is then estimated as the ratio of these two sums, as shown by the following formula:

$$R = \frac{\sum_{t1}^{t2} U}{\sum_{t1}^{t2} I}$$

In other words, the addition of the samples of coil current and voltage can be started from the current threshold I1, and this addition is halted when the coil current reaches this threshold again.

The method for estimating resistance is implemented when the device 2 is in the open state, preferably during phase P1 described above. In this case, optionally but advantageously, the estimation method may be implemented as soon as the device 2 is switched on, to ensure that the operating conditions of the device conform to safety requirements before the closing phase can be initiated.

The method for estimating resistance may also be implemented when the device 2 is in the closed state, notably during the holding phase P3 described above. In this case, the current pulse may be one of the periodic oscillations 42 of the current due to the chopping of the coil voltage implemented by the power supply circuit 24.

Thus a reliable and relatively simple way of estimating the resistance is provided, regardless of the state of the device 2.

In a variant, this calculation may be simplified by estimating the resistance R using the following formula:

$$R = \frac{(R2+R1)/R1 \cdot \sum_{t}^{t+Ton} trs + \frac{Toff}{Ton+Toff} \cdot Dr1 - RT4 \cdot \sum_{t}^{t+Ton} Icoil}{\sum_{c}^{c+Ton+Toff} Icoil} - (Rsh + RT1)$$

in which the sum $\sum_{t}^{t+Ton+Toff} Icoil$ is the sum of the coil currents measured between the times t1 and t2, "trs" is the measured coil voltage (first measurement voltage V1), "t" is the time t1 defined above, Ton is the duration of the current pulse between the first time t1 and the current spike 52 (the maximum value), the constants R1, R2, Rsh are values of the previously defined eponymous resistances of the power supply circuit 24, Dr1 is the voltage of the diode Dr1 in the conducting state, RT1 is the impedance of the first switch T1, RT4 is the impedance of the second switch, and Toff is the remaining duration of the pulse after the current spike 52 and up to the second time t2.

The values of R1 and R2 may be considered to be design constants specific to the device 2 and recorded in memory, for example during the construction of the device 2. The constants Dr1, RT4, Rsh, RT1 are constants specific to the device 2, which may also be recorded in memory, but whose value may be temperature-dependent.

In practice, known values of these constants may be recorded in memory in advance and then loaded when the device 2 is started, and may then be updated during the operation of the device, for example during correction operations, on the basis of the temperature values estimated in step 114 described below, and of laws specifying the variation of each constant as a function of temperature.

Optionally, the identification of the times t1 and t2 includes a correction substep to improve the accuracy of the detection.

This is because, depending on the methods used to detect when the threshold value I1 is crossed, it is possible that the crossing may be detected with a delay, thus introducing an error into the estimation of resistance.

Notably, in step 110, in order to minimize the measurement error during the falling phase, instead of stopping at the first current measurement having a value below the threshold value I1, the time t2 is considered to be the time at which the nearest current value to the threshold value I1 is measured, even if this measured value is greater than the threshold value I1.

In other words, when this correction is implemented, the second time t2 is identified as the time for which the measured current value is the nearest of the measured current values to the threshold value I1 when said current is decreasing after the spike of the pulse.

It will be apparent that, notably, the method primarily enables the resistance of the coil 22 to be estimated. Advantageously, other properties of the coil 22, such as the temperature and inductance, may be estimated in subsequent steps, on the basis of the estimated resistance value.

For example, in a step 114, the control device 26 estimates the temperature of the coil 22 on the basis of the estimated coil resistance value R.

According to an example of embodiment, the estimation of the coil temperature can be carried out iteratively over time, starting from a preceding temperature value.

This estimation may be carried out by means of the following formula:

$$Temp_2 = \frac{\frac{Rbob_1}{Rbob_2} - 1}{K} + Temp_1$$

in which Temp2 is the new temperature estimate, Temp1 is the preceding temperature estimate, Rbob2 is the current value of the resistance of the coil 22, Rbob1 is a preceding value of the resistance of the coil 22, and K is the thermal coefficient of the material forming the coil (copper, for example). The values of resistance of the coil are, for example, estimated by means of the method described above.

Step 114 may be repeated on a number of occasions over time, periodically for example. In the first iteration of step 114, it is possible use as the initial values Rbob1 and Temp1 from the initial values measured or estimated during the first switch-on of the device 2 and then recorded in the memory of the control device 26.

In other embodiments, in a step 116, the control device 26 estimates the inductance of the coil 22 on the basis of the estimated resistance value.

For example, the inductance of the coil, denoted L, may be estimated on the basis of the following formula:

$$L = \frac{Drl.Toff - (Rsh + RT1 + Rbob) \cdot \sum_{t+Ton}^{t+Ton+Toff} Icoil}{(Icoil_{Ton} - Icoil_{Toff})}$$

in which the values shown are those defined previously. The values $Icoil_{Ton}$ and $Icoil_{Toff}$ correspond, respectively, to the current values measured for the current spike 52 and for the end of the current pulse t2.

Thus the inductance may be estimated simply, taking all the voltage drops into account. The result is more accurate, since it takes into account all the parameters that may give rise to a greater or lesser degree of inaccuracy, such as residual voltages and parasitic resistances. Moreover, the calculation is easy to implement; that is to say, only a few calculation resources are required.

These examples are not limiting and the steps 114 or 116 could be implemented in a different way.

In a variant, the steps of the method could be executed in a different order. Some steps might be omitted. The described example does not prevent, in other embodiments, other steps from being implemented conjointly or sequentially with the described steps.

The invention makes it possible to determine, automatically and reliably, the value of the resistance of the coil of the actuator during the operation of the device, without the need for a dedicated sensor. Other properties, such as the temperature and the inductance, may then be estimated on the basis of the estimate of the resistance. Thus an easily implemented method is provided for obtaining reliable values concerning the state of the coil 22, without the need to add supplementary sensors (such as a sensor of the temperature near the coil 22).

Optionally, the state of the device 2 (open or closed state) may be determined from one or more of the properties estimated by the above method.

For example, a method of determining the state of the device 2 may include a step, not illustrated, of comparing one or more of these estimated properties with one or more reference values. The state of the device 2 is determined on the basis of the result of this comparison.

Any feature of one of the embodiments or variants described above may be implemented in the other described embodiments and variants.

The invention claimed is:

1. A method for estimating a property of an electrical switching device, said device including an electromagnetic actuator comprising a coil, the method comprising:
   measuring electric current flowing through the coil;
   measuring supply electrical voltage of a control circuit for the actuator;
   injecting an electric current pulse into the coil of the actuator;
   identifying a first time corresponding to a time for which the current flowing through the coil reaches a predetermined threshold value when said current increases following the injection of the pulse;
   identifying a second time corresponding to a time for which the current flowing through the coil again reaches the predetermined threshold value when said current decreases after a spike of the pulse;
   estimating a resistance of the coil on the basis of a ratio of a sum of the values of said voltage that are measured between the second time and the first time, to a sum of the values of said current that are measured between the second time and the first time; and
   estimating an inductance of the coil of the actuator on the basis of the estimated resistance value,
   wherein the inductance is calculated by means of the following formula:

$$L = \frac{Drl.Toff - (Rsh + RT1 + Rbob) \cdot \sum_{t+Ton}^{t+Ton+Toff} Icoil}{(Icoil_{Ton} - Icoil_{Toff})}$$

in which Rbob is the estimated resistance value, I coil$_{Ton}$ and Icoil$_{Toff}$ are, respectively, the current values measured at the peak of the pulse and at the end of the pulse of current, Toff is the remaining duration of the current pulse after the peak of the pulse has been reached, and Dr1, Rsh and RT1 are design constants specific to the device, recorded in memory.

2. The method according to claim 1, further comprising estimating a temperature of the coil of the actuator on the basis of the estimated resistance value.

3. The method according to claim 2, wherein the temperature of the coil is calculated iteratively by means of the following formula:

$$Temp_2 = \frac{\frac{Rbob_1}{Rbob_2} - 1}{K} + Temp_1$$

in which Temp2 is the current value of the temperature of the coil, Temp1 is the preceding estimate of the temperature, Rbob2 is the current value of the resistance of the coil, Rbob1 is a preceding value of the resistance of the coil, and K is the thermal coefficient of the material forming the coil.

4. The method according to claim 1, wherein the resistance of the coil is estimated by means of the following formula:

$$R = \frac{(R2 + R1)/R1 \cdot \sum_{t}^{t+Ton} trs + \frac{Toff}{Ton + Toff} \cdot Drl - RT4 \cdot \sum_{t}^{t+Ton} Icoil}{\sum_{c}^{c+Ton+Toff} Icoil} - (Rsh + RT1)$$

in which the sum $\Sigma_t^{t+Ton+Toff}$ Icoil is the sum of the current values measured between the first and second times, "trs" is the measured coil voltage, "t" is the first time, Ton is the duration of the current pulse between the first time and the reaching of a peak value of the current pulse, Toff is the remaining duration of the current pulse after the peak current has been reached and up to the second time, and Dr1, Rsh, R1, R2, RT4 and RT1 are design constants for the device, recorded in memory.

5. The method according to claim 1, wherein the method is implemented when the switching device is in an open state.

6. The method according to claim 1, wherein the method is implemented when the switching device is in a closed state.

7. The method according to claim 6, wherein the method is implemented during a holding phase in which the current pulse is repeated periodically.

8. The method according to claim 1, wherein the second time is identified as a time for which the measured current value is a nearest of the measured current values to the predetermined threshold value when said current is decreasing after the spike of the pulse.

9. An electrical switching device, including an electromagnetic actuator comprising a coil and a control circuit configured to implement:
measuring an electric current flowing through the coil;
measuring a supply electrical voltage of a control circuit for the actuator;
injecting an electric current pulse into the coil of the actuator;
identifying a first time corresponding to a time for which the current flowing through the coil reaches a predetermined threshold value when said current increases following the injection of the pulse;
identifying a second time corresponding to a time for which the current flowing through the coil again reaches the predetermined threshold value when said current decreases after a spike of the pulse;
estimating a resistance of the coil on the basis of a ratio of a sum of the values of said voltage that are measured between the second time and the first time, to a sum of the values of said current that are measured between the second time and the first time; and
estimating an inductance of the coil of the actuator on the basis of the estimated resistance value,
wherein the inductance is calculated by means of the following formula:

$$L = \frac{Drl.Toff - (Rsh + RT1 + Rbob) \cdot \sum_{t+Ton}^{t+Ton+Toff} Icoil}{(Icoil_{Ton} - Icoil_{Toff})}$$

in which Rbob is the estimated resistance value, I coil$_{Ton}$ and Icoil$_{Toff}$ are, respectively, the current values measured at the peak of the pulse and at the end of the pulse of current, Toff is the remaining duration of the current pulse after the peak of the pulse has been reached, and Dr1, Rsh and RT1 are design constants specific to the device, recorded in memory.

10. A method for estimating a property of an electrical switching device, said device including an electromagnetic actuator comprising a coil, the method comprising:
measuring electric current flowing through the coil;
measuring supply electrical voltage of a control circuit for the actuator;
injecting an electric current pulse into the coil of the actuator;
identifying a first time corresponding to a time for which the current flowing through the coil reaches a predetermined threshold value when said current increases following the injection of the pulse;
identifying a second time corresponding to a time for which the current flowing through the coil again reaches the predetermined threshold value when said current decreases after a spike of the pulse; and
estimating a resistance of the coil on the basis of a ratio of a sum of the values of said voltage that are measured between the second time and the first time, to a sum of the values of said current that are measured between the second time and the first time
wherein the resistance of the coil is estimated by means of the following formula:

$$R = \frac{(R2+R1)/R1 \cdot \sum_{t}^{t+Ton} trs + \frac{Toff}{Ton+Toff} \cdot Drl - RT4 \cdot \sum_{t}^{t+Ton} Icoil}{\sum_{t}^{t+Ton+Toff} Icoil} - (Rsh + RT1)$$

in which the sum $\sum_{t}^{t+Ton+Toff} Icoil$ is the sum of the current values measured between the first and second times, "trs" is the measured coil voltage, "t" is the first time, Ton is the duration of the current pulse between the first time and the reaching of a peak value of the current pulse, Toff is the remaining duration of the current pulse after the peak current has been reached and up to the second time, and Dr1, Rsh, R1, R2, RT4 and RT1 are design constants for the device, recorded in memory.

11. The method according to claim 10, further comprising estimating an inductance of the coil of the actuator on the basis of the estimated resistance value.

12. The method according to claim 11, wherein the inductance is calculated by means of the following formula:

$$L = \frac{Drl.Toff - (Rsh + RT1 + Rbob) \cdot \sum_{t+Ton}^{t+Ton+Toff} Icoil}{(Icoil_{Ton} - Icoil_{Toff})}$$

in which Rbob is the estimated resistance value, $Icoil_{Ton}$ and $Icoil_{Toff}$ are, respectively, the current values measured at the peak of the pulse and at the end of the pulse of current, Toff is the remaining duration of the current pulse after the peak of the pulse has been reached, and Dr1, Rsh and RT1 are design constants specific to the device, recorded in memory.

13. The method according to claim 10, further comprising estimating a temperature of the coil of the actuator on the basis of the estimated resistance value.

14. The method according to claim 13, wherein the temperature of the coil is calculated iteratively by means of the following formula:

$$Temp_2 = \frac{\frac{Rbob_1}{Rbob_2} - 1}{K} + Temp_1$$

in which Temp2 is the current value of the temperature of the coil, Temp1 is the preceding estimate of the temperature, Rbob2 is the current value of the resistance of the coil, Rbob1 is a preceding value of the resistance of the coil, and K is the thermal coefficient of the material forming the coil.

15. The method according to claim 10, wherein the method is implemented when the switching device is in an open state.

16. The method according to claim 10, wherein the method is implemented when the switching device is in a closed state.

17. The method according to claim 16, wherein the method is implemented during a holding phase in which the current pulse is repeated periodically.

18. The method according to claim 10, wherein the second time is identified as a time for which the measured current value is a nearest of the measured current values to the predetermined threshold value when said current is decreasing after the spike of the pulse.

19. An electrical switching device, including an electromagnetic actuator comprising a coil and a control circuit configured to implement the method according to claim 10.

* * * * *